(12) United States Patent
Ma (10) Patent No.: US 11,221,525 B2
(45) Date of Patent: Jan. 11, 2022

(54) DISPLAY DEVICE AND FLEXIBLE CIRCUIT BOARD

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Yongda Ma, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 249 days.

(21) Appl. No.: 16/610,442

(22) PCT Filed: May 28, 2019

(86) PCT No.: PCT/CN2019/088860
§ 371 (c)(1),
(2) Date: Nov. 1, 2019

(87) PCT Pub. No.: WO2019/228361
PCT Pub. Date: Dec. 5, 2019

(65) Prior Publication Data
US 2021/0333590 A1 Oct. 28, 2021

(30) Foreign Application Priority Data
May 31, 2018 (CN) .......................... 201820841914.4

(51) Int. Cl.
*G02F 1/1345* (2006.01)
*G02F 1/13357* (2006.01)
*H05K 1/11* (2006.01)

(52) U.S. Cl.
CPC ...... *G02F 1/1345* (2013.01); *G02F 1/133602* (2013.01); *H05K 1/118* (2013.01); *H05K 2201/10136* (2013.01)

(58) Field of Classification Search
CPC ............. G02F 1/1345; G02F 1/133602; G02F 1/1333; G02F 1/13338; H05K 1/118; H05K 2201/10136; H05K 1/189; H01L 27/323; H01L 27/3276; G06F 1/1641; G06F 1/1643; G06F 1/1652
See application file for complete search history.

(56) References Cited

FOREIGN PATENT DOCUMENTS

| CN | 101131488 A | 2/2008 |
|----|-------------|--------|
| CN | 101713874 A | 5/2010 |
| CN | 103529578 A | 1/2014 |
| CN | 208172458   | 11/2018 |
| TW | 200935124   | 8/2009 |

*Primary Examiner* — Joseph L Williams
*Assistant Examiner* — Jose M Diaz (57) ABSTRACT

A display device and a flexible circuit board are provided. The display device includes: a display panel having a first bonding region, the first bonding region being provided with a plurality of first connection terminals; a touch panel having a second bonding region, the second bonding region being provided with a plurality of second connection terminals; a flexible circuit board having a first surface and a second surface opposite to the first surface; first conductive structures disposed on the first surface of the flexible circuit board and configured to be connected with the plurality of first connection terminals; second conductive structures, disposed on the second surface of the flexible circuit board and configured to be connected with the plurality of second connection terminals.

18 Claims, 5 Drawing Sheets

DISPLAY DEVICE AND FLEXIBLE CIRCUIT BOARD

This application claims the benefit of Chinese patent application No. 201820841914.4 filed on May 31, 2018, which is hereby entirely incorporated by reference as a part of the present application.

TECHNICAL FIELD

Embodiments of the present disclosure relate to a display device and a flexible circuit board.

BACKGROUND

With the development in the display technology field, various display devices with a display function appear in people's daily life, such as mobile phones, tablet computers, televisions, notebook computers, digital photo frames, and navigators, and each of these display devices without exception needs to be assembled with a display panel. If the display devices are required to have a touch function, the display devices also need to be provided with a touch panel. However, because each of the display panel and the touch panel separately needs to be connected with a flexible printed circuit (FPC for short), the process is complex and the manufacturing cost is high.

SUMMARY

According to a first aspect of the present disclosure, a display device is provided and comprises:

a display panel, comprising a first bonding region, the first bonding region being provided with a plurality of first connection terminals;

a touch panel, comprising a second bonding region, the second bonding region being provided with a plurality of second connection terminals;

a flexible circuit board, comprising a first surface and a second surface opposite to the first surface;

first conductive structures on the first surface of the flexible circuit board, the first conductive structures being configured to be connected with the plurality of first connection terminals; and second conductive structures on the second surface of the flexible circuit board, the second conductive structures being configured to be connected with the plurality of second connection terminals.

In at least some embodiments, orthographic projections of the first conductive structures on the flexible circuit board do not coincide with orthographic projections of the second conductive structures on the flexible circuit board.

In at least some embodiments, the flexible circuit board comprises a first insulating layer, a conductive layer and a second insulating layer which are sequentially stacked;

the first insulating layer has a first hollow region, the first conductive structures are in the conductive layer, and the first conductive structures are in an orthographic projection region of the first hollow region on the conductive layer, the second insulating layer has a second hollow region, the second conductive structures are in the conductive layer, and the second conductive structures are in an orthographic projection region of the second hollow region on the conductive layer.

In at least some embodiments, the first bonding region of the display panel and the second bonding region of the touch panel are respectively at two opposite sides of the flexible circuit board.

In at least some embodiments, each of the plurality of first connection terminals is connected with one of the first conductive structures at a side of the flexible circuit board, and each of the plurality of second connection terminals is connected with one of the second conductive structures at another side of the flexible circuit board opposite to the side of the flexible circuit board.

In at least some embodiments, orthographic projections of the first conductive structures on the flexible circuit board overlap orthographic projections of the second conductive structures on the flexible circuit board.

In at least some embodiments, the display device further comprises a first anisotropic conductive film and a second anisotropic conductive film, the plurality of first connection terminals are connected with the first conductive structures in the flexible circuit board through the first anisotropic conductive film, and the plurality of second connection terminals are connected with the second conductive structures in the flexible circuit board through the second anisotropic conductive film.

In at least some embodiments, the display panel is provided with a plurality of signal lines, each of the plurality of signal lines is correspondingly connected with one of the plurality of first connection terminals.

In at least some embodiments, the plurality of signal lines comprise a plurality of data lines and a plurality of gate lines.

In at least some embodiments, the flexible circuit board further comprises a source driving module and a gate driving module, and the source driving module and the gate driving module are both electrically connected with the first conductive structures.

In at least some embodiments, the touch panel is provided with a plurality of touch electrodes, and each of the plurality of touch electrodes is correspondingly connected with one of the plurality of second connection terminals.

In at least some embodiments, the plurality of touch electrodes comprise a plurality of touch sensing electrodes and a plurality of touch driving electrodes.

In at least some embodiments, the flexible circuit board is further provided with a touch control chip, and the touch control chip is electrically connected with the second conductive structures.

In at least some embodiments, the display panel is a liquid crystal display panel, and the liquid crystal display panel comprises an array substrate, a color filter substrate, and a liquid crystal layer between the array substrate and the color filter substrate, and the first bonding region is in the array substrate.

In at least some embodiments, the display device further comprises a backlight source, and the display panel is between the backlight source and the touch panel.

According to a second aspect of the present disclosure, a flexible circuit board comprising a first surface and a second surface opposite to the first surface is provided, and the flexible circuit board further comprising:

first conductive structures on the first surface of the flexible circuit board; and second conductive structures on the second surface of the flexible circuit board.

In at least some embodiments, orthographic projections of the first conductive structures on the flexible circuit board do not coincide with orthographic projections of the second conductive structures on the flexible circuit board.

In at least some embodiments, the flexible circuit board comprises a first insulating layer, a conductive layer and a second insulating layer which are sequentially stacked, the first insulating layer has a first hollow region, the first conductive structures are in the conductive layer, and the first conductive structures are in an orthographic projection region of the first hollow region on the conductive layer, the second insulating layer has a second hollow region, the second conductive structures are in the conductive layer, and the second conductive structures are in an orthographic projection region of the second hollow region on the conductive layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
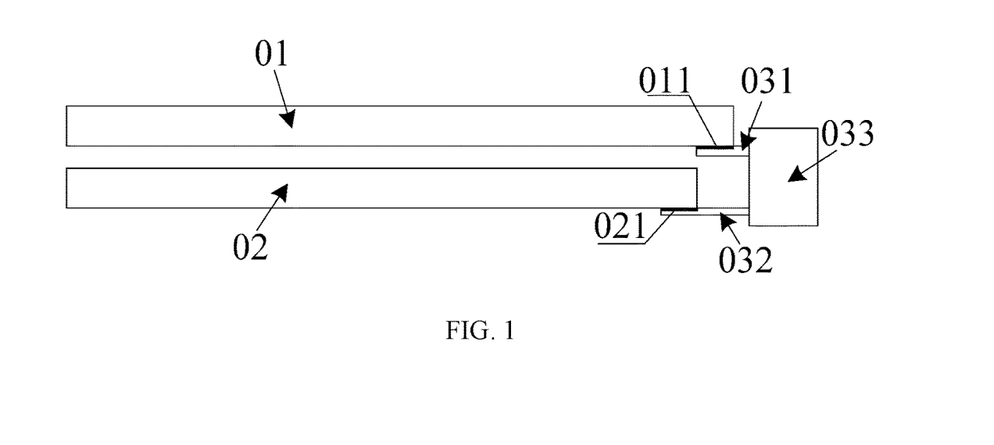
FIG. 1 is a schematic structural view of a display device provided by a related technique.

FIG. 1 is a schematic structural view of a display device. With reference to FIG. 1, the display device may include a touch panel 01 and a display panel 02. A bonding region of the touch panel 01 is provided with a plurality of first connection terminals 011, the plurality of first connection terminals 011 are respectively connected with a plurality of touch driving electrodes and a plurality of touch sensing electrodes in the touch panel 01. The plurality of first connection terminals 011 may be connected with a first FPC 031, and the first FPC 031 enables the display device to have a touch function. A bonding region of the display panel 02 is provided with a plurality of second connection terminals 021, the plurality of second connection terminals 021 are respectively connected with a plurality of data lines and a plurality of gate lines in the display panel 02. The plurality of second connection terminal 021 may be connected with a second FPC 032, and the second FPC 032 enables the display device to have a display function; in the display device, the second FPC 032 connected with the display panel 02 and the first FPC 031 connected with the touch panel 01 converge and are connected to a main control FPC 033.

Because a plurality of FPCs (for example, the first FPC 031, the second FPC 032, and the main control FPC 033) are usually required in the display device, the manufacturing process of the display device is complex, and the manufacturing cost of the display device is high.

Figure 2:
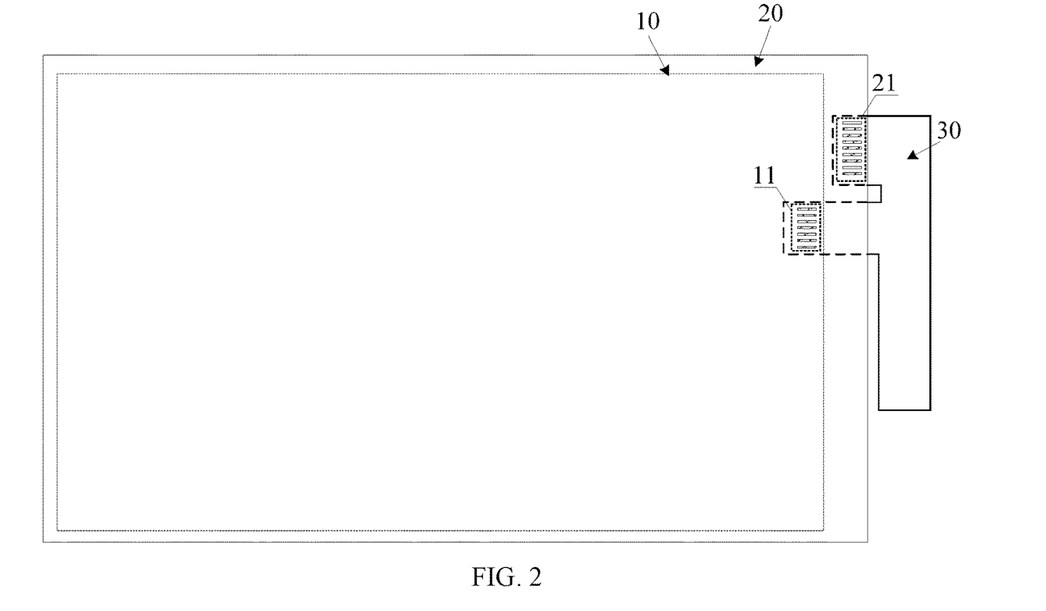
FIG. 2 is a top view of the display device according to the embodiments of the present disclosure.

FIG. 2 is a top view of a display device according to the embodiments of the present disclosure. With reference to FIG. 2, the display device may include a display panel 10, a touch panel 20 and an FPC 30.

Figure 3A:
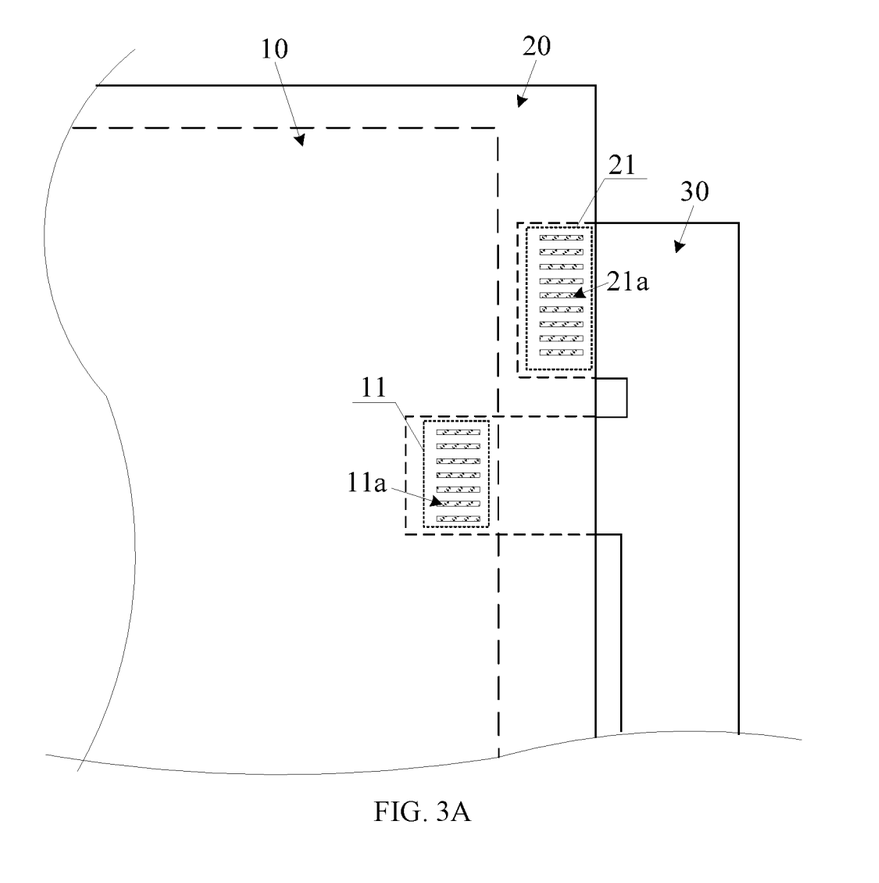
FIG. 3A is a partial enlarged view of the display device shown in FIG. 2.
Figure 3B:
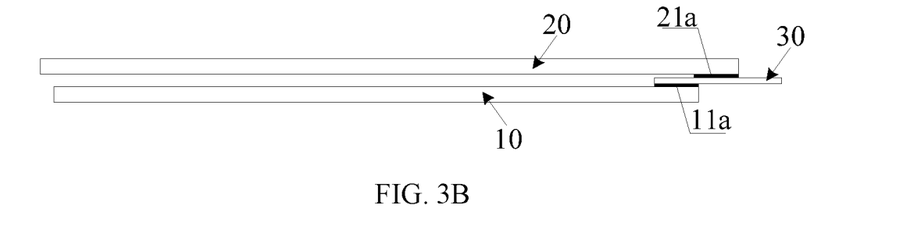
FIG. 3B is a right side view of the display device shown in FIG. 2.

The display panel 10 has a first bonding region 11, and the touch panel 20 has a second bonding region 21. In order to more clearly see the structures of the first bonding region 11 in the display panel 10 and the second bonding region 21 in the touch panel 20, and see the positional relationship between the display panel 10, the touch panel 20 and the FPC 30, please refer to FIGS. 3A and 3B, FIG. 3A is a partial enlarged view of the display device illustrated in FIG. 2, and FIG. 3B is a right side view of the display device illustrated in FIG. 2; the first bonding region 11 is provided with a plurality of first connection terminal 11a, the second bonding region 21 is provided with a plurality of second connection terminals 21a, and the FPC 30 is located between the display panel 10 and the touch panel 20.

For example, the FPC 30 is provided with first conductive structures and second conductive structures, the first conductive structures are configured to be connected with the plurality of first connection terminals 11a, and the second conductive structures are configured to be connected with the plurality of second connection terminals 21a. In order to clearly see the positions of the first conductive structures and the second conductive structures disposed in the FPC 30, please refer to FIG. 4A, which is a top view of the FPC provided by the embodiments of the present disclosure; the FPC 30 has a first surface and a second surface opposite to the first surface, the first surface of the FPC 30 is provided with the first conductive structures 31, and the display panel 10 may be loaded with a display signal through the FPC 30, so that the display device has a display function; referring to FIG. 4B which is a bottom view of the FPC according to the embodiments of the present disclosure, the second surface of the FPC 30 is provided with the second conductive structures 32, and the touch panel 20 may be loaded with a touch signal through the FPC 30 so that the display device has a touch function.

Figure 4A:
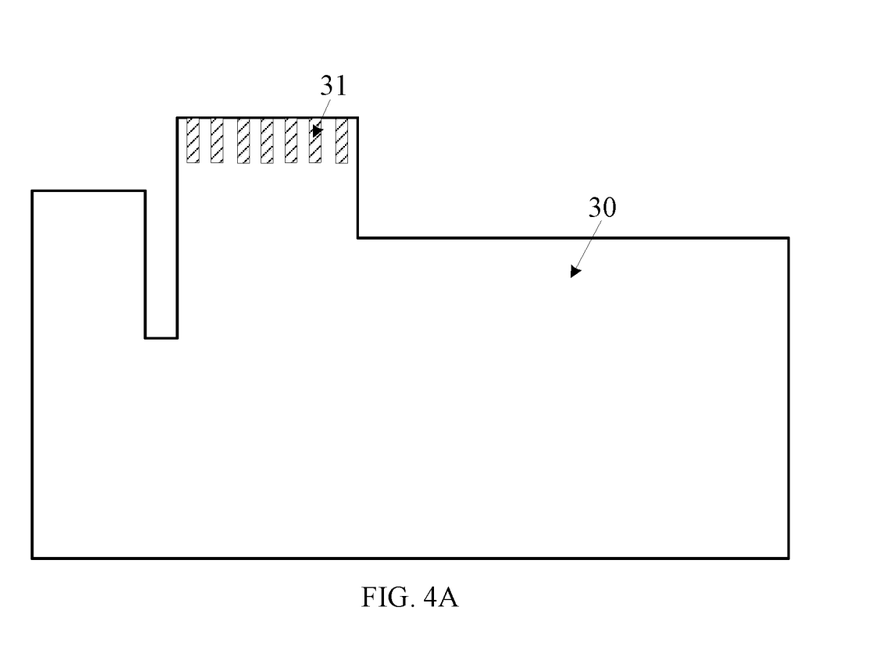
FIG. 4A is a top view of an FPC provided by the embodiments of the present disclosure.
Figure 4B:
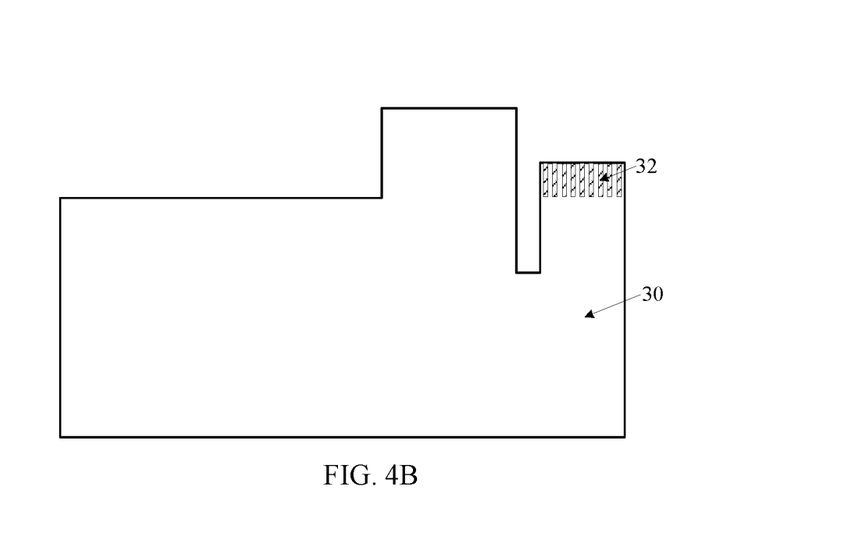
FIG. 4B is a bottom view of the FPC provided by the embodiments of the present disclosure.

As shown in FIG. 4A and FIG. 4B, orthographic projections of the first conductive structures 31 on the FPC 30 do not coincide with orthographic projections of the second conductive structures 32 on the FPC 30, so that the FPC 30 can respectively load different signals into the display panel 10 and the touch panel 20, which effectively avoids the phenomenon that the FPC 30 loads the display signal into the touch panel 20 or loads the touch signal into the display panel 10.

It should be noted that, in order to enable the FPC 30 to be connected with both the display panel 10 and the touch panel 20, for example, the first bonding region 11 in the display panel 10 and the second bonding region 21 in the touch panel 20 are at two opposite sides of the FPC 30 respectively. For example, the first bonding region 11 and the second bonding region 21 are both located at a same side edge of the display device.

In the above display device, by providing a single FPC which is connected with the respective connection terminals of the display panel and the respective connection terminals of the touch panel, the manufacturing process of the display device is simplified and the manufacturing cost of the display device is reduced.

Optionally, as shown in FIG. 3B, each first connection terminal 11a and the first conductive structure are connected with each other at a side of the FPC, and each second connection terminal 21a and the second conductive structures are connected with each other at another side of the FPC 30 which is opposite to the side of the FPC.

In at least some embodiments, the display panel is provided with a plurality of signal lines, and each of the plurality of signal lines is correspondingly connected with one of the plurality of first connection terminals disposed in the first bonding region. For example, the plurality of signal lines include a plurality of data lines and a plurality of gate lines.

In at least some embodiments, the touch panel is provided with a plurality of touch electrodes, and each of the plurality of touch electrodes is correspondingly connected with one of the plurality of second connection terminals disposed in the second bonding region. For example, the plurality of touch electrodes may include a plurality of touch sensing electrodes and a plurality of touch driving electrodes.

Figure 5:
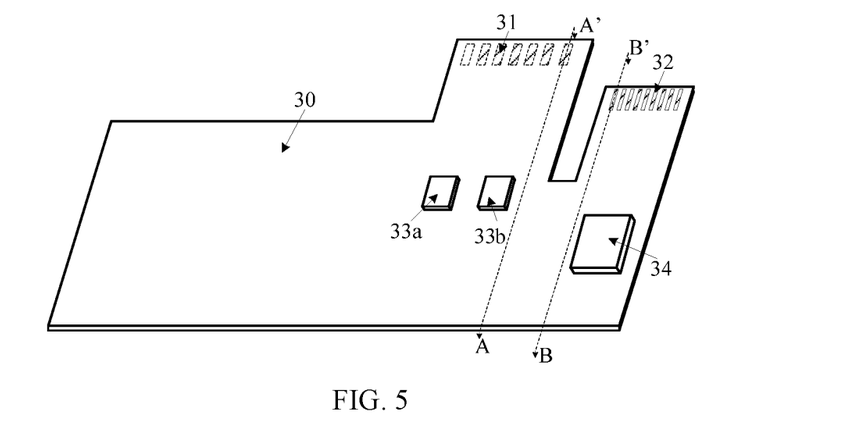
FIG. 5 is a schematic structural view of another FPC according to the embodiments of the present disclosure.

Referring to FIG. 5 which is a schematic structural view of another FPC according to the embodiments of the present disclosure, the FPC 30 further includes a source driving module 33a, a gate driving module 33b and a touch control chip 34.

The source driving module 33a and the gate driving module 33b are both electrically connected with the first conductive structures 31; by using the first conductive structures 31 and the plurality of first connection terminals disposed in the first bonding region of the display panel, it can be realized that the plurality of data lines in the display panel are connected with the source driving module 33a, and that the plurality of gate lines in the display panel are connected with the gate driving module 33b, so that the source driving module 33a and the gate driving module 33b can apply the display signal to the display panel, so as to enable the display device to have the display function. It should be noted that the source driving module 33a and the gate driving module 33b may be respectively integrated on different chips, or the source driving module 33a and the gate driving module 33b may be integrated on the same chip.

The touch control chip 34 is electrically connected with the second conductive structures 32; by using the second conductive structures 32 and the plurality of second conductive terminals disposed in the second bonding region of the touch panel, it can be realized that the plurality of touch electrodes in the touch panel are connected with the touch control chip 34, so that the touch control chip 34 can apply a touch signal to the plurality of touch electrodes in the touch panel, so as to enable the display device to have the touch function.

It should be noted that the FPC is further provided with other electronic components, such as a chip resistor, a chip capacitor, a pressure sensor, a photosensitive LED, a distance sensing detecting device, and the like.

In the embodiments of the present disclosure, the display panel in the display device may be a liquid crystal display panel or an organic light-emitting diode (OLED for short) display panel.

Figure 6:
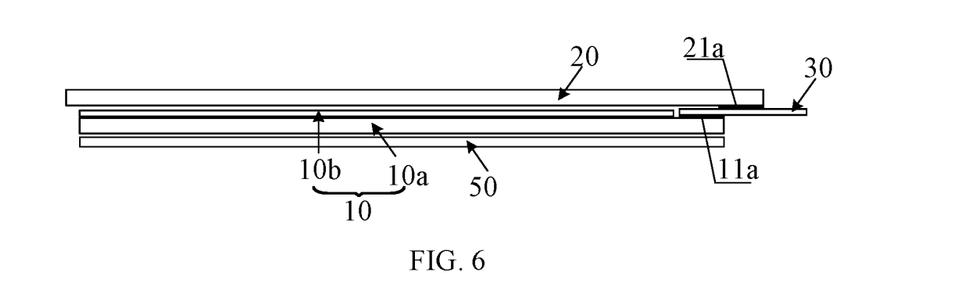
FIG. 6 is a schematic structural view of another display panel according to the embodiments of the present disclosure.

In an exemplary implementation, referring to FIG. 6 which is a schematic structural view of another display panel according to the embodiments of the present disclosure, when the display panel is the liquid crystal display panel, the display panel 10 may include an array substrate 10a and a color filter substrate 10b, and a liquid crystal layer (not shown) between the array substrate 10a and the color filter substrate 10b, the first bonding region 11 is located in the array substrate 10a, and the plurality of signal lines in the display panel are also located in the array substrate 10a. The display device may further include a backlight source 50, and the backlight source 50, the display panel 10 and the touch panel 20 are sequentially stacked.

In another exemplary implementation, when the display panel is the OLED display panel, the display panel may include an array substrate and an organic light-emitting layer on the array substrate.

In the embodiments of the present disclosure, the display device may further include a cover plate; the cover plate, the display panel and the touch panel are sequentially stacked; the cover plate may be provided with an antenna, and the antenna may enable the display device to have functions of sending a signal and receiving a signal.

Figure 7A:
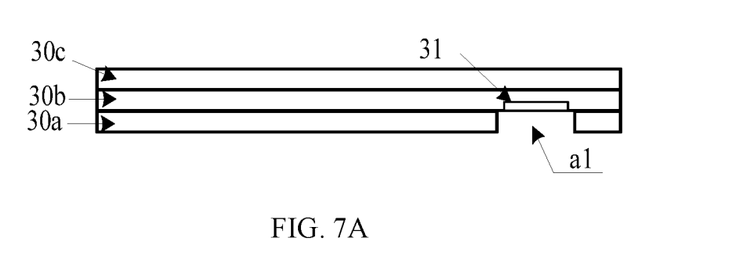
FIG. 7A is a cross-sectional view of the FPC shown in FIG. 5 taken along line A-A'.
Figure 7B:
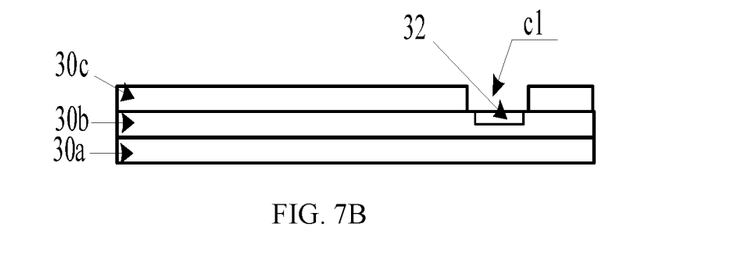
FIG. 7B is a cross-sectional view of the FPC shown in FIG. 5 taken along line B-B'.

Optionally, referring to FIG. 7A and FIG. 7B, FIG. 7A is a cross-sectional view of the FPC shown in FIG. 5 along a line AA', and FIG. 7B is a cross-sectional view of the FPC shown in FIG. 5 along a line BB'. The FPC 30 may include a first insulating layer 30a, a conductive layer 30b and a second insulating layer 30c which are sequentially stacked. The first insulating layer 30a has a first hollow region a1, the first conductive structures are disposed in the conductive layer 30b; the first conductive structures are located in an orthographic projection region of the first hollow region a1 on the conductive layer 30b, and the plurality of first connection terminals of the display panel may be connected with the first conductive structures through the first hollow region a1. The second insulating layer 30c has a second hollow region c1, the second conductive structures are also provided in the conductive layer 30b; the second conductive structures are located in an orthographic projection region of the second hollow region c1 on the conductive layer 30b, and the plurality of second connection terminals of the touch panel may be connected with the second conductive structures through the second hollow region c1.

Figure 9:
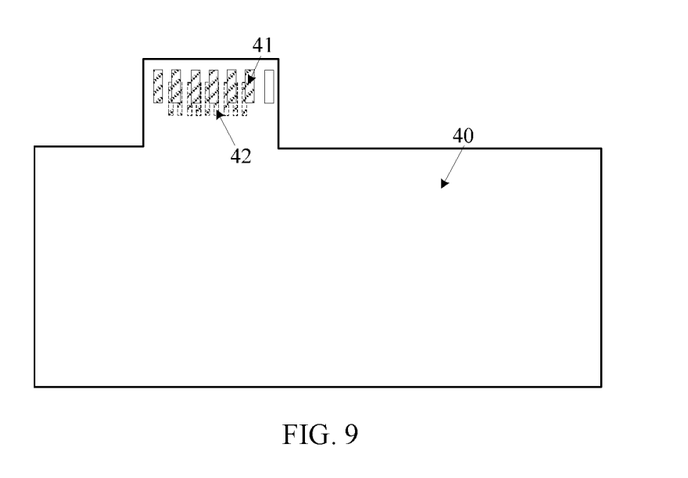
FIG. 9 is a schematic structural view of yet another FPC according to the embodiments of the present disclosure.

It should be noted that, in the embodiments of the present disclosure, exemplary descriptions are given by taking the case that the orthographic projections of the first conductive structures on the FPC completely do not coincide with the orthographic projections of the second conductive structures on the FPC as an example; in another optional implementation, the orthographic projections of the first conductive structures on the flexible circuit board may overlap the orthographic projections of the second conductive structures on the flexible circuit board, and in this case, the orthographic projections of the first conductive structures on the FPC partially overlap and partially do not overlap the orthographic projections of the second conductive structures on the FPC. In order to avoid the phenomenon that the FPC loads the display signal into the touch panel or loads the touch signal into the display panel, it is necessary to provide an insulating layer between the first conductive structures and the second conductive structures. For example, as shown in FIG. 9, the first conductive structures 41 and the second conductive structures 42 are respectively located at two opposite sides of the flexible circuit board 40, and the orthographic projections of the first conductive structures 41 on the flexible circuit board 40 may overlap the orthographic projections of the second conductive structures on the flexible circuit board 40.

Figure 8:
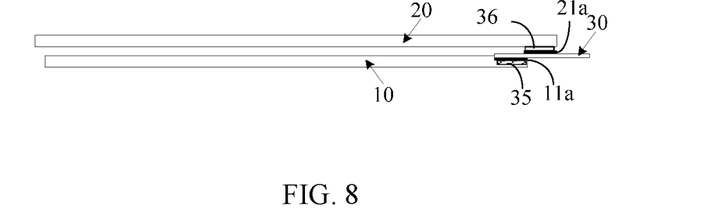
FIG. 8 is a schematic structural view of still another display device according to the embodiments of the present disclosure.

In the embodiments of the present disclosure, as shown in FIG. 8, the display device may further include a first anisotropic conductive film (ACF for short) 35 and a second ACF 36, the plurality of first connection terminals 11a in the display panel 10 are connected with the first conductive structures in the FPC through the first ACF 35, and the plurality of second connection terminals 21a in the touch panel 20 are connected with the second conductive structures in the FPC through the second ACF 36.

The embodiments of the present disclosure further provide an FPC, which may be the FPC shown in FIG. 5.

The FPC 30 has the first surface and the second surface opposite to the first surface, the first conductive structures 31 are disposed on the first surface of the flexible circuit board 30, and the second conductive structures 32 are disposed on the second surface of the flexible circuit board 30.

Optionally, the orthographic projections of the first conductive structures on the flexible circuit board do not coincide with the orthogonal projections of the second conductive structures on the flexible circuit board.

Optionally, the flexible circuit board includes: the first insulating layer, the conductive layer and the second insulating layer which are sequentially stacked; the first insulating layer has the first hollow region, the first conductive structures are disposed in the conductive layer, the first conductive structures are located in the orthographic projection region of the first hollow region on the conductive layer, the second insulating layer has the second hollow region, the second conductive structures are further disposed in the conductive layer, and the second conductive structures are located in the orthographic projection region of the second hollow region on the conductive layer.

Optionally, the flexible circuit board further includes the source driving module, the gate driving module and the touch control chip, the source driving module and the gate driving module are electrically connected with the first conductive structures, and the touch control chip is electrically connected with the second conductive structures.

It should be noted that the working principle of the FPC in the foregoing embodiments may refer to the corresponding part in the foregoing embodiments of the display device, and details are not described herein again.

In this article, the following points need to be explained.

(1) The drawings of the embodiments of the present disclosure relate only to the structures mentioned in the embodiments of the present disclosure, and other structures can be referred to the general design.

(2) For the sake of clarity, in the drawings for describing embodiments of the present disclosure, the thicknesses of layers or regions are enlarged or reduced, that is, the drawings are not drawn to actual scales.

(3) In the case of no conflict, the embodiments of the present disclosure and the features in the embodiments may be combined with each other to obtain a new embodiment.

What are described above is related to the illustrative embodiments of the disclosure only and not limitative to the scope of the disclosure; the scopes of the disclosure are defined by the accompanying claims.

What is claimed is:

1. A display device, comprising:
   a display panel, comprising a first bonding region, the first bonding region being provided with a plurality of first connection terminals;
   a touch panel, comprising a second bonding region, the second bonding region being provided with a plurality of second connection terminals;
   a flexible circuit board, comprising a first surface and a second surface opposite to the first surface;
   first conductive structures on the first surface of the flexible circuit board, the first conductive structures being configured to be connected with the plurality of first connection terminals; and
   second conductive structures on the second surface of the flexible circuit board, the second conductive structures being configured to be connected with the plurality of second connection terminals.

2. The display device according to claim 1, wherein orthographic projections of the first conductive structures on the flexible circuit board do not coincide with orthographic projections of the second conductive structures on the flexible circuit board.

3. The display device according to claim 1, wherein:
   the flexible circuit board comprises a first insulating layer, a conductive layer and a second insulating layer which are sequentially stacked;
   the first insulating layer has a first hollow region, the first conductive structures are in the conductive layer, and the first conductive structures are in an orthographic projection region of the first hollow region on the conductive layer,
   the second insulating layer has a second hollow region, the second conductive structures are in the conductive layer, and the second conductive structures are in an orthographic projection region of the second hollow region on the conductive layer.

4. The display device according to claim 1, wherein the first bonding region of the display panel and the second bonding region of the touch panel are respectively at two opposite sides of the flexible circuit board.

5. The display device according to claim 4, wherein each of the plurality of first connection terminals is connected with one of the first conductive structures at a side of the flexible circuit board, and each of the plurality of second connection terminals is connected with one of the second conductive structures at another side of the flexible circuit board opposite to the side of the flexible circuit board.

6. The display device according to claim 1, wherein orthographic projections of the first conductive structures on the flexible circuit board overlap orthographic projections of the second conductive structures on the flexible circuit board.

7. The display device according to claim 1, wherein the display device further comprises a first anisotropic conductive film and a second anisotropic conductive film, the plurality of first connection terminals are connected with the first conductive structures in the flexible circuit board through the first anisotropic conductive film, and the plurality of second connection terminals are connected with the second conductive structures in the flexible circuit board through the second anisotropic conductive film.

8. The display device according to claim 1, wherein the display panel is provided with a plurality of signal lines, each of the plurality of signal lines is correspondingly connected with one of the plurality of first connection terminals.

9. The display device according to claim 8, wherein the plurality of signal lines comprise a plurality of data lines and a plurality of gate lines.

10. The display device according to claim 8, wherein the flexible circuit board further comprises a source driving module and a gate driving module, and the source driving module and the gate driving module are both electrically connected with the first conductive structures.

11. The display device according to claim 1, wherein the touch panel is provided with a plurality of touch electrodes, and each of the plurality of touch electrodes is correspondingly connected with one of the plurality of second connection terminals.

12. The display device according to claim 11, wherein the plurality of touch electrodes comprise a plurality of touch sensing electrodes and a plurality of touch driving electrodes.

13. The display device according to claim 12, wherein the flexible circuit board is further provided with a touch control chip, and the touch control chip is electrically connected with the second conductive structures.

14. The display device according to claim 1, wherein:
the display panel is a liquid crystal display panel, and the liquid crystal display panel comprises an array substrate, a color filter substrate, and a liquid crystal layer between the array substrate and the color filter substrate, and the first bonding region is in the array substrate.

15. The display device according to claim 14, wherein the display device further comprises a backlight source, and the display panel is between the backlight source and the touch panel.

16. A flexible circuit board, comprising a first surface and a second surface opposite to the first surface, the flexible circuit board further comprising:
first conductive structures on the first surface of the flexible circuit board; and
second conductive structures on the second surface of the flexible circuit board.

17. The flexible circuit board according to claim 16, wherein orthographic projections of the first conductive structures on the flexible circuit board do not coincide with orthographic projections of the second conductive structures on the flexible circuit board.

18. The flexible circuit board according to claim 16, comprising a first insulating layer, a conductive layer and a second insulating layer which are sequentially stacked, wherein:
the first insulating layer has a first hollow region, the first conductive structures are in the conductive layer, and the first conductive structures are in an orthographic projection region of the first hollow region on the conductive layer,
the second insulating layer has a second hollow region, the second conductive structures are in the conductive layer, and the second conductive structures are in an orthographic projection region of the second hollow region on the conductive layer.

\* \* \* \* \*